United States Patent
Datta et al.

(10) Patent No.: US 6,660,339 B1
(45) Date of Patent: Dec. 9, 2003

(54) PROCESS FOR HYDROPHOBIC TREATMENT OF WATER VAPOR PERMEABLE SUBSTRATES

(75) Inventors: Saswati Datta, Cincinnati, OH (US); Paul Amaat Raymond Gerard France, West Chester, OH (US); Arseniy Valerevich Radomyselskiy, Cincinnati, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 10/070,485

(22) PCT Filed: Sep. 7, 1999

(86) PCT No.: PCT/US99/20422
§ 371 (c)(1),
(2), (4) Date: Jun. 21, 2002

(87) PCT Pub. No.: WO01/17696
PCT Pub. Date: Mar. 15, 2001

(51) Int. Cl.[7] .............................................. C23C 16/48
(52) U.S. Cl. .................. 427/497; 427/501; 427/509; 427/513; 427/551; 427/255.5; 427/255.6
(58) Field of Search .................. 427/497, 501, 427/509, 513, 535, 551, 255.5, 255.6

(56) References Cited

U.S. PATENT DOCUMENTS 5,328,576 A  * 7/1994 Paskalov et al. ............. 204/164
5,773,098 A    6/1998 Thomas
6,083,628 A  * 7/2000 Yializis ...................... 428/463
6,503,564 B1 * 1/2003 Fleming et al. ........... 427/255.6

FOREIGN PATENT DOCUMENTS

| FR | 2 156 786 A1 | 6/1973 |
| WO | WO 95/10117 A1 | 4/1995 |
| WO | WO 96/31649 A1 | 10/1996 |
| WO | WO 98/18852 A1 | 5/1998 |

* cited by examiner

Primary Examiner—Timothy Meeks
(74) Attorney, Agent, or Firm—Kevin C. Johnson

(57) ABSTRACT

The present invention relates to a process, preferably a continuous process, of coating a substrate, which allows water vapor and preferably air permeation, with a hydrophobic coating. The process preferably uses a thin film vacuum condensation step to create a monomer coating which is cured in situ after the coating. The process has the benefit of allowing continuous operation and providing an alternative to existing processes for hydrophobic coating. The substrates are coated such that the water vapour permeation sites are not blocked by the coating to maintain the desired breathability. The static water contact angle on the surface of such substrates is more than 95°. Such substrates are preferably employed in absorbent articles such as diapers, incontinence products, underarm sweat pads, sanitary napkins, catamenials, pantiliners, breast pads, shoe inserts of bandages or alternatively in protective garments such as gloves or rain coats for which water vapor transmission in particular from the inside to the outside is highly desirable.

11 Claims, No Drawings

PROCESS FOR HYDROPHOBIC TREATMENT OF WATER VAPOR PERMEABLE SUBSTRATES

FIELD OF THE INVENTION

The present invention relates to a process, preferably a continuous process, of coating a substrate, which allows water vapour and preferably air permeation, with a hydrophobic coating. The process preferably uses a thin film vacuum condensation step to create a monomer coating which is cured in situ after the coating. The process has the benefit of allowing continuous operation and providing a alternative to existing processes for hydrophobic coating. The substrates are coated such that the water vapour permeation sites are not blocked by the coating to maintain the desired breathability. The static water contact angle on the surface of such substrates is more than 95°. Such substrates are preferably employed in absorbent articles such as diapers, incontinence products, underarm sweat pads, sanitary napkins, catamenials, pantiliners, breast pads, shoe inserts or bandages or alternatively in protective garments such as gloves or rain coats for which water vapour transmission in particular from the inside to the outside is highly desirable.

BACKGROUND OF THE INVENTION

For instance, U.S. Pat. No. 3,498,527 teaches that paper board containers for liquids can be waterproofed by application of a waterproofing coating such as wax or polyethylene, and a similar method is shown in U.S. Pat. No. 2,708,645 for waterproofing paper drinking cups and in U.S. Pat. No. 3,212,697 for paper grocery sacks. In U.S. Pat. No. 3,597,313, temporary wet strength is imparted to paper by coating it with a polymeric alcohol-polymeric aldehyde reaction product. Coating processes, by themselves, have been used to produce disposable articles of sanitary clothing. In U.S. Pat. No. 3,078,849, a disposable sanitary napkin is disclosed which consists of an adsorbent layer having a liquid-repellent backing of polyvinyl alcohol or similar material capable of initially repelling water but eventually solubilizing. The degree of water-repellency, therefore the lifetime of the napkin, is controlled by varying the thickness of the backing. Because the necessary life of the napkin cannot be predicted by manufacturer or user, the backing must be sufficiently thick to take account of all normal contingencies. U.S. Pat. No. 3,542,028 is directed to a flushable sanitary napkin consisting of a cellulosic sheet treated with a fluoropolymer coating. U.S. Pat. No. 3,559,650 teaches the preparation of a sanitary napkin having two flush-disposable sides separated by a waterproof film too thin to support itself once both faces of the napkin have disintegrated upon disposal.

Analogous to the process of coating a surface with a waterproofing substance is the concept of reacting a surface with another material so as to form a reaction product on the surface which has water-repellent properties. For example, U.S. Pat. Nos. 2,130,212 and 3,137,540 teach that materials such as polymeric alcohols may be reacted with other materials to increase their water-repellent properties. The latter patent teaches treating polyvinyl alcohol articles with an aqueous emulsion of an aldehyde to impart water-repellency thereto. U.S. Pat. No. 3,626,943 teaches that disposable diapers can be made from polyvinyl alcohol and waterproofed on one side by reaction with formaldehyde. These reaction-type coating processes suffer from drawbacks. They are carried out in the aqueous phase which is complicated and requires relatively large quantities of reagents. Most of the processes which employ some form of in situ chemical reaction to produce a water-repellent surface are carried out in the liquid phase, some vapor phase treatments are taught by U.S. Pat. Nos. 2,306,222; 2,961,388; and 3,017,290. A known method of water and oil repellent finishing of textiles, described in U.S. Pat. No. 1,158,634, includes plasma treatment in a glow discharge in an atmosphere of inorganic gases, followed by treatment with a fluorine containing acrylic monomer in gas phase. Another prior method of achieving film plasma polymerization, described in U.S. Pat. No. 4,188,426, includes treatment in a glow discharge of per-fluoro-cyclo-butane or hexafluoroethane to reduce the friction coefficient and to improve the surface hydrophobia of organic and inorganic substrates (e.g. polyethylene films, metals). However these disclosures do not achieve a level of water repellency as the present invention when employing the coating process disclosed herein.

Plasma coating processes of metals, polymers, and other substrates, with fluorocarbon films are also known in the art. As an example, it is known from U.S. Pat. No. 4,869,922, that deposition from continuous (i.e. non modulated) radiofrequency (RF) glow discharges fed with fluorocarbons provides films, layers, tapes, plates, and differently shaped articles made of plastics, metals or other materials, with a thin fluorocarbon coating, with no other material interposed between the coating itself and the substrate. Such coatings are claimed to have very good adherence to the items processed, to be void-free, to be uniform, continuous and to show controlled wettability characteristics, which depend on their surface chemical composition. The non modulated, continuous plasma process of the above mentioned patent leads to coatings characterized by static water contact angle (WCA) values lower than 120°.

U.S. Pat No 5,328,576 discloses a method for imparting water and oil repellent surface properties to fabrics or paper that includes pretreatment in a low pressure oxygen plasma in the presence of water vapor followed by plasma polymerization of methane in a high frequency glow discharge carried out in the same treatment chamber. This method doesn't deliver durable, permanent coatings with a WCA higher than about 120°.

U.S. Pat. No. 5,262,208 discloses an gas plasma treatment for archival preservation of paper manuscripts by a thin film protective polymer film. The treatment time is ranging from 30–3600 seconds. Other methods have been used to obtain thin coatings on the web materials with short treatment periods. Providing surface treatment is disclosed in U.S. Pat. Nos. 4,842,893 and 4,954,371 which describe a process for high speed coating of substrates with a complete and uniformly adhering layer and using electron beam radiation curing of the vapor deposited monomers for multilayer capacitators. U.S. Pat. No. 4,842,893 discloses high speed coating process including flash vaporization system and electron beam curing. Both of these electron beam disclosures are incorporated herein by reference. Other uses of electron beam coatings in the electronic industry field have been reported by Westinghouse science & technology center USA (Adv. Mat. Newsletter Volume 13, No 9, 1991 page 4).

While different water repellent treatments have been used in the past, such as monomer solution coating and curing, coating during laundering, plasma coating, there remains the need for having an other method that results in thin, preferably durable repellent coatings that can be obtained at high production speeds and with minimal changes in the substrate properties, such as flexibility, texture, comfort, and breathability. The present invention combines the advantages of the above mentioned high speed electron beam process for coating of a substrate with the benefit of producing an article with durable and water-repellent coating.

Thus although the materials employed in the practice of this invention are known in the art and are known in the context of water-repellent coatings, the process utilizing electron beam treatment for hydrophobic coatings provides an attractive alternative to the methods of the prior art.

SUMMARY OF THE INVENTION

In one aspect of the present invention, the method of using a high speed vacuum coating process for producing durable and thin water-repellent coatings on a substrate uses a movable support such as rotating drum in a vacuum chamber. The surface of the support is maintained at a temperature sufficient to permit condensation of a vaporized material deposited in the chamber. The material is a curable monomer with a relatively low molecular weight. The monomer vapor is created using a flash vaporizer. The desired amount of curable monomer is metered to a heated flash vaporizer system where the material is vaporized. It is then transported e.g. by it's inherent pressure, to the substrate resting on the rotating drum and condensed on the surface of the substrate. According to the method the substrate is then transported to a curing means such as an energy source which emits an electron beam, UV-light radiation or exposure to an electro magnetic field. Alternative the curable monomer can also be transferred into radicals by passing through a plasma zone (zone of high voltage discharge). The curing of the monomer by the curing means then provides a coating on the substrate surface which has a static water contact angle of more than 95°.

The method for delivering the curable monomer to the substrate for minimizing the amount of monomers can use an ultrasonic atomizer producing micro droplets of curable monomer. They are released into a vaporization tube heated by band heaters. The atomized droplets impinge on the inner wall of the vaporization tube and are instantaneously vaporized, i.e., flash vaporized. This reduces the opportunity for polymerization prior to being deposited on the substrate.

In one aspect of the present invention, the substrate can be one side water-repellent and capable of absorbing and storing fluids from the other side, or alternatively be repellent on both sides.

DETAILED DESCRIPTION OF THE INVENTION

As discussed in detail below, a preferred embodiment of the present invention relates to a method of providing a durable water-repellent coating to a substrate material, using a high speed electron beam radiation process. The terms "hydrophobic" and "water-repellent" are used interchangeably and refer to surfaces that are repellent to aqueous liquids (e.g., body liquids) deposited on these surfaces. Hydrophobicity and wettability are defined in terms of static water contact angle and alternative the surface tension of the liquids and solids involved. This is discussed in detail in the American Chemical Society publication entitled Contact Angle, Wettability and Adhesion, edited by Robert F. Gould (Copyright 1964). A surface is hydrophobic if the static water contact angle is greater than 90° and the liquid does not spread spontaneously across the surface of the web. In general, the higher the contact angle between the surface and the liquid, the more hydrophobic the surface.

The coatings of the present invention are "durably hydrophobic", insofar as the hydrophobic character engendered to the substrate is maintained after exposure to liquids and humid air.

The coating formed by the method of the present invention has a thickness of less than 5 microns, and preferably less than 2 microns and most preferably in the range of 0.001 to 1 microns. The coatings are formed by depositing a vapor of curable monomer, under vacuum, on a movable substrate which is mounted in thermal contact with a support, for continues processing preferably a rotating drum, which is maintained at a temperature below the boiling point of the vaporized monomer under the environmental conditions in vacuum chamber. As a result of this temperature differential, the monomer vapor condenses on the surface of the substrate. The monomer materials utilized in the present invention are relatively low in molecular weight, between 150 and 1000 Atomic Mass Units (AMU), and preferably in the range 200 to 300 AMU. Polyfunctional flurocarbons and especially fluoroacrylates or mixtures of monofunctional fluoroacrylates and polyfunctional fluoroacrylates are preferred. The monomers or monomer mixtures employed have an average of about two or more double bonds (i.e., a plurality of olefinic groups) and have a vapor pressure such that they condense on the substrate surface. Such vapor pressures are for example pressure between about $1.33 \cdot 10^{-6}$ mbar and $1.33 \cdot 10^{-1}$ mbar, most preferably a vapor pressure of approximately $1.33 \cdot 10^{-2}$ mbar at standard temperature and pressure, (i.e., relatively low boiling materials) are selected.

These high-vapor-pressure monomers can be flash vaporized already at low temperatures and thus are not degraded (cracked) by the heating process. The absence or low amount of unreactive degradation products results in coatings with a reduced levels of volatile components in which substantially all of the deposited monomer is reactive and will cure to form an integral film when exposed to a source of radiation. These properties make it possible to provide a substantially continuous coating despite the fact that the deposited film is very thin. The cured films exhibit excellent adhesion and are resistant to chemical attack by organic solvents and inorganic salts.

The process according to the present invention can continuously create substrate surfaces having a hydrophobic characteristic such that the static water contact angle is more than 95°, preferably more than about 120°, more preferably higher than about 130° and most preferably between about 150° and about 165°. The static water contact angle value can be measured with a water contact angle goniometer. The measurement is done on a flat, i.e. plane, and smooth surface of a substrate after coating. The term smooth as used herein for water contact angle measurements refers to a roughness of no more than 5 microns in accordance with standard roughness measurements on continuous surfaces.

Curable Fluoro-containing Monomer

According to the present invention, the high speed vacuum coating process for producing water vapour permeable substrates with exceptional water repellent properties or on either one side or both sides requires a curable monomer component. Desirably, the curable monomer for obtaining water-repellent coatings comprises fluoro-containing group.

In one emodiment, any suitable fluoromonomer may be used, including, but not limited to, fluoroacrylate monomers, fluoro olefin monomers, fluorostyrene monomers, fluoroalkylene oxide monomers (e.g., perfluoropropylene oxide, perfluorocyclohexene oxide), fluorinated vinyl alkyl ether monomers, and the copolymers thereof with suitable comonomers, wherein the comonomers are fluorinated or unfluorinated. Fluoromonomers which are polymerized by a free radical polymerization process are preferred.

In one embodiment, fluorostyrenes and fluorinated vinyl alkyl ether monomers which may be used in the method of the present invention include, but are not limited to, α-fluorostyrene; β-fluorostyrene; α, β-difluorostyrene; β, β-difluorostyrene; α, β, β-trifluorostyrene; α-trifluoromethylstyrene; 2,4,6-Tris (trifluoromethyl) styrene; 2,3,4,5,6-pentafluorostyrene; 2,3,4,5,6-pentafluoro-α-methylstyrene; and 2,3,4,5,6-pentafluoro-β-methylstyrene.

In yet another embodiment, tetrafluoroethylene can also be used in the method of the present invention and include, but are not limited to, tetrafluoroethylene-hexafluoropropylene copolymers, tetrafluoroethylene-perfluorovinyl ether copolymers (e.g., copolymers of tetrafluoroethylene with perfluoropropyl vinyl ether), tetrafluoroethylene-ethylene copolymers, and perfluorinated ionomers (e.g., perfluorosulfonate ionomers; perfluorocarboxylate ionomers).

In still another embodiment, fluorocarbon elastomers (see, e.g., 7 Encyclopedia of Polymer Science & Engineering 257) are a group of fluoro olefin polymers which can also be used in the process of the present invention and include, but are not limited to, poly(vinylidene fluoride-co-hexafluoropropylene); poly(vinylidene fluoride-co-hexafluoropropylene-co-tetrafluoroethylene); poly [vinylidene fluoride-co-tetrafluoroethylene-co-perfluoro (methyl vinyl ether)]; poly[tetrafluoroethylene-co-perfluoro (methyl vinyl ether)]; poly(tetrafluoroethylene-co-propylene; and poly(vinylidene fluoride-co-chlorotrifluoroethylene).

In the preferred emodiment, because of their reactivity, physical properties, and the properties of cured films formed from such components, fluoroacrylates are particularly useful monomeric materials. The term "fluoroacrylate monomer," as used herein, refers to esters of acrylic acid ($H_2C=CHCOOH$) or methacrylic acid ($H_2C=CCH_3—COOH$), where the esterifying group is a fluorinated group such as perfluoroalkyl. A specific group of fluoroacrylate monomers useful in the method of the invention are compounds represented by formula (I): $H_2C=CR_1—COO(CH_2)_n, R_2$ (I) wherein: n is 1 or 2; $R_1$ is hydrogen or methyl; and $R_2$ is a perfluorinated aliphatic or perfluorinated aromatic group, such as a perfluorinated linear or branched, saturated or unsaturated $C_1$ to $C_{10}$ alkyl, phenyl, or naphthyl.

In a particular embodiment of the invention, $R_2$ is a $C_1$ to $C_8$ perfluoroalkyl or —$CH_2$—$NR_3$—$SO_2$—$R_4$, wherein $R_3$ is $C_1$–$C_2$ alkyl and $R_4$ is $C_1$ to $C_8$ perfluoroalkyl. The term "perfluorinated," as used herein, means that all or essentially all hydrogen atoms on an organic group are replaced with fluorine. Monomers illustrative of Formula (I) above, and their abbreviations, include the following:

2-(N-ethylperfluorooctanesulfonamido) ethyl acrylate ("EtFOSEA");
2-(N-ethylperflooctanesulfonamido) ethyl methacrylate ("EtFOSEMA");
2-(N-methylperfluorooctanesulfonamido) ethyl acrylate ("MeFOSEA");
2-(N-methylperflooctanesulfonamido) ethyl methacrylate ("MeFOSEMA");
1,1-Dihydroperfluorooctyl acrylate ("FOA"); and
1,1-Dihydroperfluorooctyl methacrylate ("FOMA").

Alternatively, the curable monomer component can also include polyfunctional acrylates, which are set forth in U.S. Pat. No. 4,842,893, incorporated herein by reference.

Substrate

The substrate for coating according to the process of the present invention can be any substrate which supports water vapour transport through it. The substrate can for example be an apertured film which allows free air circulation through the apertures or a woven or non-woven which also allows free air circulation through the pores of the woven or non-woven. The substrates can however also be impermeable to air passage such as microporous substrates (usually Ca filled films which are stretched) or vapour transmitting monolithic films. Particularly preferred are substrates which can be employed in garments or absorbent articles such as those listed above. Substrates can be coated from one or both sides and the coating can be identical or different depending on the desired final use of such substrates.

Due to the low cost and continuous process ability according to the present invention the substrates are useful in disposable articles such as diapers, sanitary napkins, pantiliners, adult incontinence products, under arm sweat pads, breast pads, shoe inserts, and so for. The substrate can either be used in a position in these articles where it supports the containment function of an impermeable sheet in which case the substrate needs to provide water vapour transport without allowing liquid transport under the usual usage conditions of the article. On the other hand such substrates can also be used as liquid permeable substrates on the liquid receiving sides of such articles so that liquid deposited on the surface of the substrate is transported quickly through the substrate towards an absorbent structure from which liquid cannot or only under extreme conditions be moved back towards the user of such an article (rewet prevention). Substrates coated according to the present invention also can find utility in protective garments such as raincoats or gloves or hats or generally apparel which is beneficially provided with water vapour permeability.

Accordingly, having thus described the invention in detail, it will be obvious to those skilled in the art that various changes may be made without departing from the scope of the invention and the invention is not to be considered limited to what is described in the specification.

What is claimed is:

1. A process of providing hydrophobicity of a degree such that a static water contact angle of more than 95° is achieved on the surface of a water vapour permeable substrate by coating said substrate with a fluro-monomer while maintaining the water vapor permeability of said substrate said process being carried out in a vacuum chamber containing: (i) a support movable from a first to a second position, (ii) a vaporizer comprising an inlet and a vapor outlet said outlet being adjacent to said support when said support is at said first position, (iii) curing means at a second downstream position of said support, and (iv) means for maintaining said support at a temperature below that of said vaporizer; said process comprising the steps of (a) placing said substrate in thermal contact with said movable support in a manner permitting the surface of said substrate to move sequentially past said vapor outlet and said curing means;

(b) maintaining said substrate at a temperature below the vaporising temperature of said fluro-monomer;

(c) evacuating gas from said chamber until the pressure within said chamber is less than 1.35 Pa;

(d) selecting a curable fluro-monomer component, having an average molecular weight between 150 and 1000 Atomic Mass Units, and a vapor pressure such that it condenses at said temperature and said pressure on said substrate surface;

(e) metering a quantity of said curable component into said inlet of said vaporizer;

(f) vaporizing said curable component within said vaporizer and exhausting the vaporized curable component through said vapor outlet;

(g) moving said support with said substrate past said vapor outlet and said curing means from said first to said second position at a rate of more than 1 cm/sec;

(h) condensing a film of said monomer component on the surface of said substrate to a thickness of less than 5 μm; while moving said substrate past said vapor outlet;

(i) crosslinking said condensed monomer film while moving said substrate past said curing means, preferably throughout said thickness of said film.

2. A process according to claim 1 wherein the water contact angle of the treated surface is higher than about 120°, preferably higher than about 130°, most preferably between about 150° and about 165°.

3. A process according to claim 1 characterized in that said substrate is a perforated film or a fibrous woven or fibrous non-woven.

4. A process according to claim 1 characterized in that said curable component has a molecular weight in the range 200 to 300 Atomic Mass Units.

5. A process according to claim 1 characterized in that said rate of moving said support is from 2 m/sec to 40 m/sec.

6. A process according to claim 1 characterized in that said thickness of said film of monomer component is less than 2 μm.

7. A process according to claim 1 characterized in that said movable support is maintained at a temperature in the range of about 20° C. to about 80° C.

8. A process according to claim 1 characterized in that said vaporizer comprises means for flash vaporization of said curable component.

9. A process according to claim 1 characterized in that said movable support comprises a rotating drum.

10. A process according to claim 1 characterized in that said curing means comprises a gas discharge electron beam.

11. A process according to claim 1 characterized in that the process further comprises the step of activating the surface of said article prior to said step (h) by exposing the surface of said substrate to a plasma.

* * * * *